(12) United States Patent
Deruty

(10) Patent No.: US 11,594,241 B2
(45) Date of Patent: Feb. 28, 2023

(54) METHOD AND ELECTRONIC DEVICE FOR FORMANT ATTENUATION/AMPLIFICATION

(71) Applicant: Sony Europe B.V., Surrey (GB)

(72) Inventor: Emmanuel Deruty, Stuttgart (DE)

(73) Assignee: Sony Europe B.V., Surrey (GB)

( * ) Notice: Subject to any disclaimer, the term of this patent is extended or adjusted under 35 U.S.C. 154(b) by 0 days.

(21) Appl. No.: 16/643,847

(22) PCT Filed: Sep. 25, 2018

(86) PCT No.: PCT/EP2018/075965
§ 371 (c)(1),
(2) Date: Mar. 3, 2020

(87) PCT Pub. No.: WO2019/063547
PCT Pub. Date: Apr. 4, 2019

(65) Prior Publication Data
US 2020/0258538 A1    Aug. 13, 2020

(30) Foreign Application Priority Data

Sep. 26, 2017   (EP) ..................... 17193238

(51) Int. Cl.
| | |
|---|---|
| *G10L 25/15* | (2013.01) |
| *G10L 25/18* | (2013.01) |
| *G10L 21/0232* | (2013.01) |
| *G10L 25/30* | (2013.01) |
| *H03G 9/00* | (2006.01) |
| *H03G 9/02* | (2006.01) |

(52) U.S. Cl.
CPC ............ *G10L 25/30* (2013.01); *H03G 9/005* (2013.01); *H03G 9/025* (2013.01)

(58) Field of Classification Search
CPC ..... G10L 21/0364; G10L 25/18; G10L 19/26; G10L 25/15; G10L 19/06; G10L 21/038; G10L 21/02; G10L 21/0232; G10L 25/12; H03G 3/3089; H03G 5/165; H03G 9/005; H03G 9/025; H03G 3/00; H03G 3/3005
See application file for complete search history.

(56) References Cited

U.S. PATENT DOCUMENTS

| | | | | |
|---|---|---|---|---|
| 5,479,560 | A * | 12/1995 | Mekata ............... | G10L 21/0364 704/226 |
| 6,539,355 | B1 * | 3/2003 | Omori .................. | G10L 21/038 704/223 |
| 6,993,480 | B1 | 1/2006 | Klayman | |

(Continued)

FOREIGN PATENT DOCUMENTS

| | | |
|---|---|---|
| WO | 2015/035492 A1 | 3/2015 |
| WO | 2017/141317 A1 | 8/2017 |

OTHER PUBLICATIONS

International Search Report and Written Opinion dated Dec. 3, 2018 for PCT/EP2018/075965 filed on Sep. 25, 2018, 12 pages.

(Continued)

*Primary Examiner* — Kharye Pope
(74) *Attorney, Agent, or Firm* — Xsensus LLP

(57) ABSTRACT

A method comprising determining feature values of an input audio window and determining a formant attenuation/amplification coefficient for the input audio window based on the processing of the feature values by a neural network.

20 Claims, 12 Drawing Sheets

ISO226-2003 contours

(56) References Cited

U.S. PATENT DOCUMENTS

| | | | | |
|---|---|---|---|---|
| 2004/0122662 | A1* | 6/2004 | Crockett | G10L 21/04 704/200.1 |
| 2005/0102135 | A1* | 5/2005 | Goronzy | G10L 25/00 704/E15.001 |
| 2005/0165608 | A1* | 7/2005 | Suzuki | G10L 19/06 704/261 |
| 2006/0270467 | A1* | 11/2006 | Song | H03G 3/3089 704/E21.004 |
| 2007/0174050 | A1* | 7/2007 | Li | G10L 21/02 704/E21.009 |
| 2007/0233472 | A1* | 10/2007 | Sinder | G10L 21/003 704/219 |
| 2007/0291959 | A1* | 12/2007 | Seefeldt | H03G 3/32 381/104 |
| 2009/0067644 | A1* | 3/2009 | Crockett | H04S 7/00 381/98 |
| 2011/0038490 | A1 | 2/2011 | Yang et al. | |
| 2011/0150227 | A1* | 6/2011 | Kim | G10L 21/0272 381/1 |
| 2011/0191101 | A1 | 8/2011 | Uhle et al. | |
| 2012/0063616 | A1* | 3/2012 | Walsh | H03G 5/025 381/103 |
| 2012/0095755 | A1* | 4/2012 | Otani | G10L 25/00 704/205 |
| 2012/0232899 | A1* | 9/2012 | Koval | G10L 17/14 704/239 |
| 2013/0144615 | A1* | 6/2013 | Rauhala | H03G 3/301 704/225 |
| 2013/0166289 | A1* | 6/2013 | Suzuki | G10L 21/0264 704/226 |
| 2013/0177170 | A1* | 7/2013 | Aylward | H03G 5/165 381/98 |
| 2014/0309992 | A1* | 10/2014 | Carney | G10L 21/02 704/209 |
| 2015/0256137 | A1* | 9/2015 | Kapinos | H03G 9/005 330/75 |
| 2015/0349737 | A1* | 12/2015 | Svendsen | H03G 3/007 455/84 |
| 2016/0035370 | A1* | 2/2016 | Krini | G10L 19/06 704/209 |
| 2016/0088407 | A1* | 3/2016 | Elmedyb | H04R 25/552 381/23.1 |
| 2016/0372133 | A1* | 12/2016 | Daniel | G10L 21/0264 |
| 2016/0372135 | A1* | 12/2016 | Lee | G10L 19/00 |
| 2018/0019720 | A1* | 1/2018 | Hashimoto | H03G 5/025 |
| 2018/0262174 | A1* | 9/2018 | Chao | H03G 3/3005 |
| 2018/0359563 | A1* | 12/2018 | Tanaka | H04R 3/02 |
| 2019/0074028 | A1* | 3/2019 | Howard | G10L 15/20 |
| 2019/0287547 | A1* | 9/2019 | Furuta | H04R 3/04 |

OTHER PUBLICATIONS

"Acoustics—Normal equal-loudness-level contours," ISO 226, Aug. 15, 2003, 28 pages.
"L2 Ultramaximizer Peak Limiter Plugin | Waves," Retrieved from the Internet URL: http://www.waves.com/plugins/l2-ultramaximizer, on Sep. 15, 2017, 2 pages.
"L2-UltraMaximizer Software audio processor User's Guide," Sep. 2017, 18 pages.
"Phase Correction Plugin—InPhase | Waves," Retrieved from the Internet URL: https://www.waves.com/plugins/inphase, on Oct. 1, 2017, 2 pages.
"Q10—10 Band Paragraphic EQ Plugin | Waves," Retrieved from the Internet URL: https://www.waves.com/plugins/q10-equalizer, on Oct. 5, 2017, 3 pages.
"REAPER | Audio Production Without Limits," Digital Audio Workstation, Retrieved from the Internet URL: http://www.reaper.fm/, on Oct. 12, 2017, 4 pages.
"Waves InPhase User Guide," Jun. 2017, 21 pages.
Aichinger, P., et al., "Describing the transparency of mixdowns: The Masked-to-Unmasked-Ratio," Audio Engineering Society, Convention Paper 8344, Presented at the 130th Convention, London, UK, May 13-16, 2011, pp. 1-10.
Bitzer, J., and Leboeuf, J., "Automatic detection of salient frequencies," Audio Engineering Society, Convention Paper 7704, Presented at the 126th Convention, Munich, Germany, May 7-10, 2009, pp. 1-6.
Dannenberg, R.B., "An Intelligent Multi-Track Audio Editor," In Proceedings of the 2007 International Computer Music Conference, vol. 2, San Francisco, Aug. 2007, pp. 1-7.
Deruty, E., "Goal-Oriented Mixing," Proceedings of the 2nd AES Workshop on Intelligent Music Production, London, UK, Sep. 13, 2016, 2 pages.
Deruty, E., and Tardieu, D., "About Dynamic Processing in Mainstream Music," Journal of the Audio Engineering Society, vol. 62, No. 1/2, Jan./Feb. 2014, pp. 42-55.
Deruty, E., et al., "Human-Made Rock Mixes Feature Tight Relations Between Spectrum and Loudness," Journal of the Audio Engineering Society, vol. 62, No. 10, Oct. 2014, pp. 1-11.
Fletcher, H., and Munson, W.A., "Loudness, Its Definition, Measurement and Calculation," The Journal of the Acoustical Society of America, vol. 5, No. 2, Oct. 1993, pp. 82-108.
Hafezi, S., and Reiss, J.D., "Autonomous Multitrack Equalization Based on Masking Reduction," Journal of the Audio Engineering Society, vol. 63, No. 5, May 2015, pp. 312-323.
John, V., "Multi-Source Room Equalization: Reducing Room Resonances," Audio Engineering Society, Convention Paper 7262, Presented at the 123rd Convention, Oct. 1, 2007, 2 pages (with Abstract only).
Ma, Z., et al., "Intelligent Multitrack Dynamic Range Compression," Journal of the Audio Engineering Society, vol. 63, No. 6, Jun. 2015, pp. 412-426.
Ma, Z., et al., "Partial Loudness in Multitrack Mixing," AES 53rd International Conference, London, UK, Jan. 27-29, 2014, pp. 1-9.
Mansbridge, S., et al., "Implementation and Evaluation of Autonomous Multi-track Fader Control," Audio Engineering Society, Convention Paper 8588, Presented at the 132nd Convention, Budapest, Hungary, Apr. 26-29, 2012, pp. 1-11.
QMUL, "Automatic mixing tools for audio and music production," Center for Digital Music, Retrieved from the Internet URL: http://c4dm.eecs.qmul.ac.uk/automaticmixing/, 1 page.
Ronan, D., et al., "Analysis of the subgrouping practices of professional mix engineers," Audio Engineering Society, Convention Paper, Presented at the 142nd Convention, Berlin, Germany, May 20-23, 2017, pp. 1-13.
Ronan, D., et al., "Automatic Subgrouping of Multitrack Audio," Proc. of the 18th Int. Conference on Digital Audio Effects (DAFx-15), Trondheim, Norway, Nov. 30-Dec. 3, 2015, pp. 1-8.
Stavrou, M., "Mixing with your Mind," 2008, 1 page.
Suzuki, Y., and Takeshima, H., "Equal-loudness-level contours for pure tones," The Journal of the Acoustical Society of America, vol. 116, No. 2, Aug. 2004, pp. 918-933.
"Unfilter," Adaptive Tonal Contour Linearization, Retrieved from the Internet URL: https://www.zynaptiq.com/unfilter/, on Sep. 10, 2017, 2 pages.
Ward, D., and Reiss, J.D., "Loudness Algorithms for Automatic Mixing," Proceedings of the 2nd AES Workshop on Intelligent Music Production, London, UK, Sep. 13, 2016, 2 pages.
Ward, D., et al., "Multi-track mixing using a model of loudness and partial loudness," Audio Engineering Society, Convention Paper 8693, Presented at the 133rd Convention, San Francisco, USA, Oct. 26-29, 2012, pp. 1-9.
Lartillot, O., "MIRtoolbox 1.6.1 User's Manual," Dec. 7, 2014, pp. 1-220.

* cited by examiner

Attenuation/amplification coefficient (fact = 0)

Attenuation/amplification coefficient (fact = 0.5)

Attenuation/amplification coefficient (fact = 1.0)

METHOD AND ELECTRONIC DEVICE FOR FORMANT ATTENUATION/AMPLIFICATION

CROSS-REFERENCE TO RELATED APPLICATIONS

The present application is based on PCT filing PCT/EP2018/075965, filed Sep. 25, 2018, which claims priority to EP 17193238.7, filed Sep. 26, 2017, the entire contents of each are incorporated herein by reference.

TECHNICAL FIELD

The present disclosure generally pertains to the field of audio processing, e.g. in music production.

TECHNICAL BACKGROUND

A digital audio workstation (DAW) is an electronic device or software application for recording, editing and producing audio files such as musical pieces, speech or sound effects. DAWs typically provide a user interface that allows the user to record, edit and mix multiple recordings and tracks into a final produced piece.

Music production involves the processes of recording, mixing and mastering. A computer-based DAW typically allows for multitrack recording of audio and provides controls for playing, recording and editing audio tracks.

Modern computer-based DAWs support software plug-ins, each having its own functionality, which can expand the sound processing capabilities of the DAW. There exist for example software plug-ins for equalization, limiting, and compression. There also exist software plug-ins which provide audio effects such as reverb and echo. And there exist software plug-ins which provide sound sources to a DAW such as virtual instruments and samplers.

There exist hardware effect machines and software plug-ins for DAWs that allow to manipulate audio obtained from human voices based on pitch and formant shifting.

For example, Ref. [Unfilter] is a real-time plug-in that removes filtering effects, such as comb filtering, resonance, or excessive equalization—effectively linearizing the frequency response of a signal automatically. [Unfilter] can also apply a detected filter response to another signal, or export it to disk as an impulse response, and can even perform mastering grade adaptive, free-form, and graphic equalization.

The perception of frequencies by humans depends on the overall loudness of the audio content; so does the relative loudness of frequency ranges, and therefore the perception and detection of formants. In the field of acoustics, a formant is a range of frequencies in which there is an absolute or relative maximum in the sound spectrum. Manipulation of audio obtained from human voices may include the detection and modification of the formant amplitude (either to boost or attenuate them), while conserving the overall spectral profile. Human detection of formants is performed by assessing the relative loudness of frequency ranges, which depends on the audio's overall loudness.

There is a general need for providing computer-implemented aid to a user in the process of recording, mixing and mastering.

SUMMARY

According to a first aspect the disclosure provides a method comprising determining feature values of an input audio window and determining a formant attenuation/amplification coefficient for the input audio window based on the processing of the feature values by a neural network.

According to a further aspect the disclosure provides an electronic device comprising circuitry configured to determine feature values of an input audio window and to determine a formant attenuation/amplification coefficient for the input audio window based on the processing of the feature values by a neural network.

According to a further aspect the disclosure provides a computer program comprising instructions, which when executed on a processor cause the processor to determine feature values evaluated on an input audio window and to determine a formant attenuation/amplification coefficient for the input audio window based on the processing of the feature values by a neural network.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
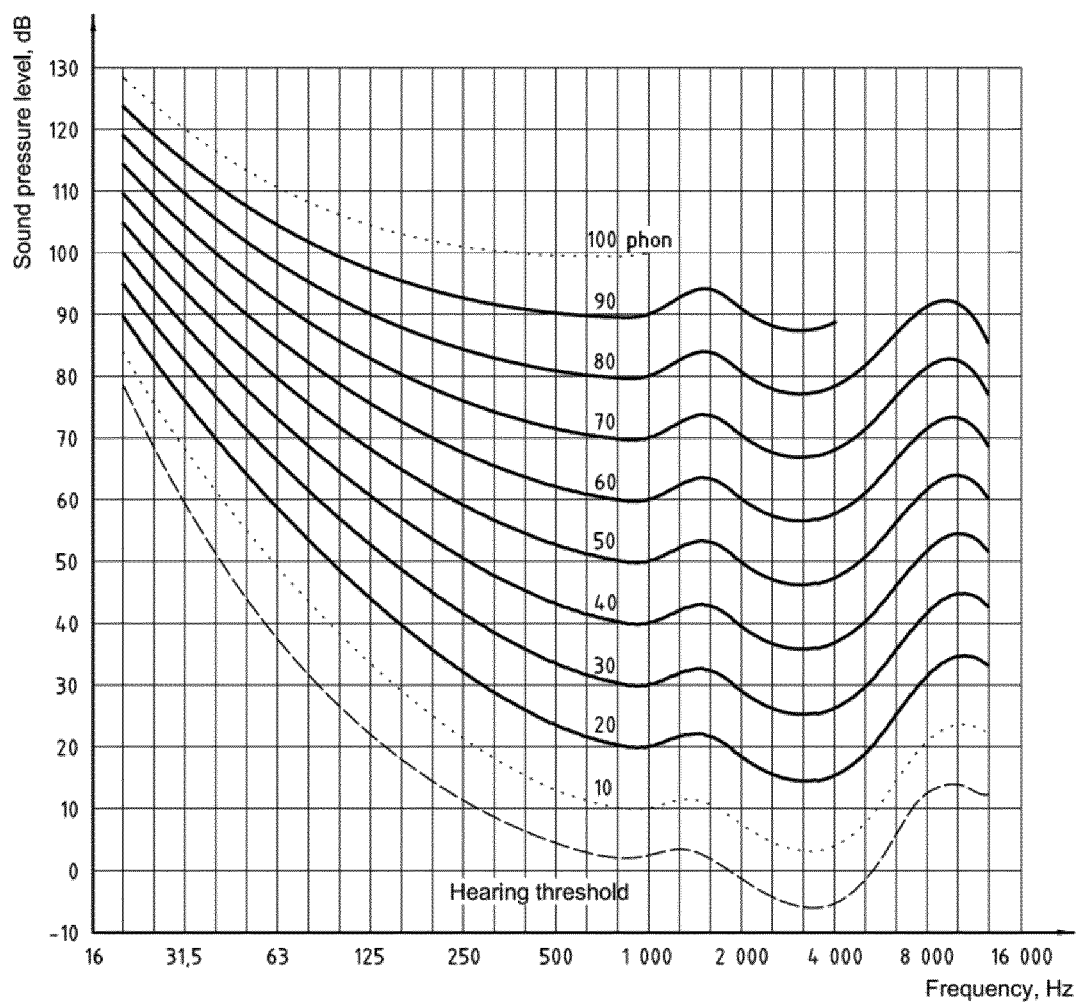
FIG. 1 shows normal equal-loudness-level contours for pure tones under free-field listening conditions as defined in International Standard ISO226-2003.

The embodiments described below in more detail provide a method comprising determining features of an input audio window and determining a formant attenuation/amplification coefficient for the input audio window based on the processing of the feature values by a neural network.

The input audio window may be obtained by windowing from an input audio file, or the input audio window may be a complete input audio file. Windowing may be done according to a standard procedure in signal processing. For example, windowing may be performed by defining a length of each window and by defining a hop size. The term audio window as used in the description of the embodiments below should also comprise using only a single window, the length of the window being equal to the length of an input audio file, i.e. the case where a single window covers a whole input file.

A formant attenuation/amplification coefficient may for example be an attenuation ratio. For example, values of an attenuation ratio greater than 1 may indicate amplification so that the formants are emphasized, values lower than 1 may indicate attenuation so that the formants are reduced, and a value of 1 may indicate that there is neither attenuation nor amplification so that the formants remain unchanged. There are other methods to express a formant attenuation/amplification coefficient. The formant attenuation/amplification coefficient may be restricted in a way so that effectively only formant attenuation is performed. Alternatively, the formant attenuation/amplification coefficient may be restricted in a way so that effectively only formant amplification is performed. That is, the embodiments can be easily restricted to amplification or attenuation only.

The method may further comprise determining formants of the input audio window and multiplying the formants with the formant attenuation/amplification coefficient. Determining the formants may comprise any known methods of determining formants of an audio file.

The input audio may be analysed. The result of the analysis may define formants. The formants may be amplified or attenuated in a proportion derived from a previous experiment, to produce the output audio. According to an embodiment, the attenuation/amplification ratio is determined by means of a neural network that has been trained in advance.

According to the methods disclosed here, the formants may automatically be set to an optimal value for a given loudness. The optimal value may for example be determined in advance by training a neural network.

According to the method, multiplying the formants with the formant attenuation/amplification coefficient may conserve the input audio file's overall spectral profile.

Determining formants of the input audio window may comprise determining the difference of two power spectra, one smoothed power spectrum and another smoothed power spectrum, one power spectrum being smoothed more than the other power spectrum. The two power spectra may for example be expressed on a logarithmic amplitude scale.

For example, determining formants of the input audio window may comprise determining a first power spectrum and a second power spectrum using a different number of bands for the first power spectrum and the second power spectrum.

The method may further comprise determining a weighted spectrum from the input audio window and multiplying the weighted spectrum with a multiplier that depends on the formant attenuation/amplification coefficient. Here, the weighted spectrum may be expressed on a linear amplitude scale. According to an alternative embodiment, the weighted spectrum may be expressed on a log amplitude scale. In this case the multiplier can be expressed as a gain, not a multiplier, and the gain would be added, not multiplied ($Log(a*b)=\log(a)+\log(b)$).

Determining a weighted spectrum from the input audio window may comprise weighting the input audio window with an equal-loudness-level contour. The equal-loudness-level contour may for example be an ISO226-2003 contour.

The method may further comprise selecting the equal-loudness-level contour based on a target monitoring loudness.

Weighting the input audio window with an equal-loudness-level contour may comprise transforming the input audio window to the spectral domain and multiplying the obtained spectrum with a processed equal-loudness-level contour. According to an alternative embodiment, in the log Y domain for both terms of the operation, multiplying may be replaced by adding the obtained spectrum and a processed equal-loudness-level contour.

According to an embodiment, the features may comprise the amplitude of formants of the input audio window.

According to a further embodiment, the features may comprise the spectral flatness or Wiener entropy of the power spectrum of the input audio window.

According to a further embodiment, the features may comprise values of the power spectrum of the input audio window.

According to a further embodiment, the features may comprise a crest factor of the input audio window.

The features mentioned here are given only for exemplifying the process. Due to the nature of neural networks there can be many combinations of features that may be used in the context of the present disclosure.

The neural network may be trained in advance with a collection of input audio windows by manually setting, for each window, the formant attenuation/amplification coefficient so that the processed audio window appears the best sounding possible. That is, the neural network is trained using, as an input, the feature values, and as an output, the formant attenuation/amplification coefficient determined by humans, so that the processed audio window appears the best sounding possible.

The methods as described above may for example be applied in an automatic audio mixing framework. For example, the solution may be deployed in a DAW, e.g. in a real-time audio plug-in that thus does automatic profile equalization.

The methods may be computer-implemented methods. For example, the methods may be implemented as a software application, a digital audio workstation (DAW) software application, or the like. The methods may also be implemented as a software plug-in, e.g. for use in a digital audio workstation software.

The embodiments further provide an electronic device comprising circuitry configured to perform the methods. The methods may for example be implemented in an electronic device comprising circuitry configured to perform the methods described above and below in more detail. The electronic device may for example be a computer, a desktop computer, a workstation, a digital audio workstation (DAW), or the like. The electronic device may also be a laptop, a tablet computer, a smartphone or the like. Circuitry of the electronic device may include one or more processors, one or more microprocessors, dedicated circuits, logic circuits, a memory (RAM, ROM, or the like), a storage, output means (display, e.g. liquid crystal, (organic) light emitting diode, etc.), loud speaker, an interface (e.g. touch screen, a wireless interface such as Bluetooth, infrared, audio interface, etc.), etc.

Target Monitoring Loudness

According to the embodiments described below, the target monitoring loudness is the median loudness at which the result will be monitored.

Given a result, different target monitoring loudness values may provide a different handling of the formants. The embodiments described below provide ways to extract and process properties of the input audio file so that, given a target monitoring loudness, the amplitude of the formants is optimized for a given target monitoring loudness. Accordingly, the audio processing chain of an automatic mixing framework presented in the embodiments below integrates the monitoring level as a parameter (see e.g. 20 in FIG. 2).

In an audio processing chain, e.g. in the context of an automated mixing framework, the target monitoring level may be set by the user in advance. Also, the target monitoring level may be derived from configurations of a main channel output level, settings of an audio interface and/or from settings of a speaker system that is used to output audio. An automated mixing framework may for example be configured so that, if a user does not provide a specific setting for the target loudness, by default, mixes are produced for medium listening levels.

Still further, on low-grade systems, the bass frequencies are attenuated, and tracks rich in low frequencies are perceived as less loud. Therefore, the principle of awareness of the target loudness awareness may be extended to a concept "mixed at the same loudness at a given monitoring level, on a given range of speakers". Embodiments may thus exploit the knowledge of the co-linearity of loudness measurement distortion brought by monitoring level and monitoring grade. The modification of the mix balance resulting from the grade of the monitoring system is comparable to the modification of the mix balance resulting from the monitoring level. The two dimensions are co-linear and can be reduced as one. In view of this, the exemplifying processes described below take account of only one parameter which may account for by monitoring level and/or monitoring grade. As an example, the resulting combination of the monitoring level and the speaker range may be set to 50 phon as default.

Equal-Loudness-Level Contours

FIG. 1 shows normal equal-loudness-level contours for pure tones under free-field listening conditions as defined in International Standard [ISO226-2003]. In the following, theses contours are called ISO226-2003 contours. International Standard [ISO226-2003] specifies combinations of sound pressure levels and frequencies of pure continuous tones which are perceived as equally loud by human listeners. An ISO226-2003 contour relates to a specific target monitoring loudness (expressed in phon) and defines a sound pressure level (in dB) for each frequency (in Hz).

Figure 2:
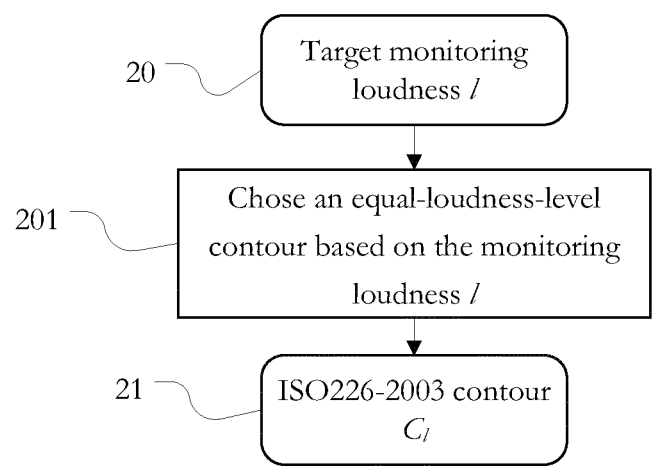
FIG. 2 schematically describes a process of selecting an equal-loudness-level contour, e.g. an ISO226-2003 contour, based on a given target monitoring loudness.

FIG. 2 schematically describes a process of selecting an equal-loudness-level contour, e.g. an ISO226-2003 contour, based on a given target monitoring loudness. A target monitoring loudness 20 is provided in advance.

Let $C_l$ be the ISO226-2003 contour at loudness l, interpolated so that its number of elements is $N_{whole}$. This target monitoring loudness may be noted and expressed in phon.

In FIG. 2, at 201 an equal-loudness-level contour is chosen based on the given target monitoring loudness 20. The respective equal-loudness-level contour may for example be obtained from International Standard ISO226-2003 described above. If, for example, the target monitoring loudness is 50 phon, the 50-phon contour will be chosen. ISO226-2003 provides in section 4.1 equations for deriving sound pressure levels from a loudness level, these sound pressure levels defining the resulting ISO226-2003 contour. Selecting an appropriate equal-loudness-level contour may for example be realized by adequately setting the loudness level parameter in these equations. Alternatively, multiple equal-loudness-level contours for a set of given loudness levels may be stored in a memory and selecting the equal-loudness-level contour may be realized by choosing the appropriate equal-loudness-level contour from the set of multiple equal-loudness-level contours based on the given loudness level.

The skilled person will readily appreciate that the embodiments described below do not necessarily have to rely on equal-loudness-level contours according to ISO226-2003. Alternative embodiments may use other equal-loudness-level contours such as Fletcher-Munson contours or Robinson-Dadson contours.

Automatic Formant Attenuation/Amplification for a Given Monitoring Loudness

Figure 3:
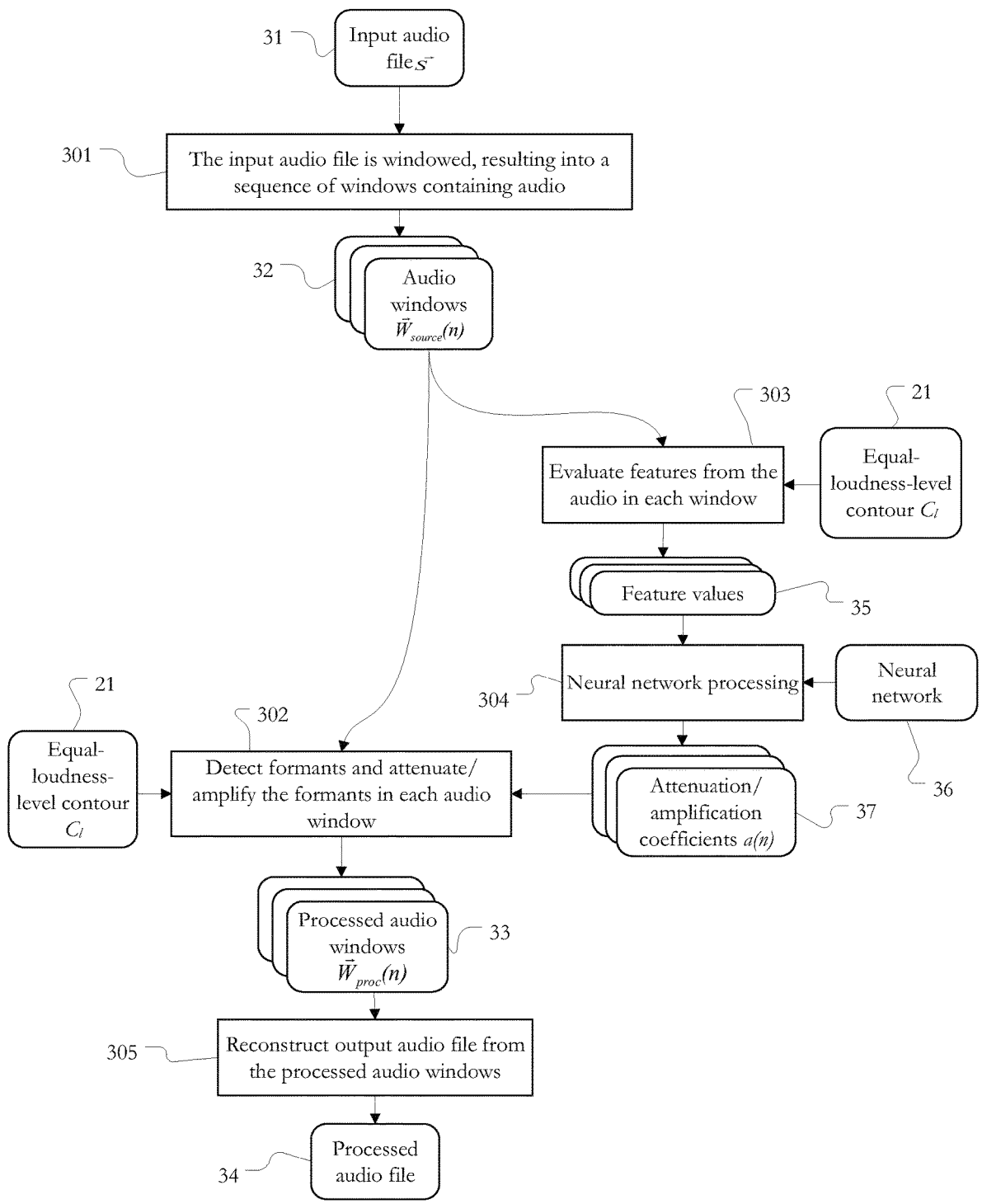
FIG. 3 schematically describes a first process of attenuating the formants in an input audio file to produce a processed audio file.

FIG. 3 schematically describes a first process of attenuating the formants in an input audio file to produce a processed audio file.

According to this embodiment the input file is mono, so that a mono version embodiment of the process will be used. If the input file is stereo, a stereo version of the process will be used which is described in section "Stereo file" in more detail.

The input of the process is a mono audio file 31. the process starts from a mono input audio file.

The output of the process is a processed mono audio file 34.

Let $\vec{S}$ be the input audio file. Let $f_s$ be its sampling frequency.

Let $N_{whole}$ be the number of samples on the audio file.

At 301, the input audio file 31 is windowed, resulting into a sequence 301 of possibly overlapping windows containing audio. Windowing is standard procedure in signal processing (see e.g. [Lartillot 2014]). In the embodiment described here, the windowing process is performed as follows:

Let the $n^{th}$ window be written $\vec{W}_{source}(n)$.

Let $N_{window}$ be the length of each window. Let $h_{window}$ be the hop size, with $h_{window} \leq N_{window}$.

Typical values are $N_{window}=1 \times f_s$ samples, and $h_{window}=0.5 \times f_s$ samples.

The $n^{th}$ window $\vec{W}_{source}(n)$ contains the audio samples $1+((n-1) \times h_{window})$ to $N_{window}+((n-1) \times h_{window})$.

For the audio in each window 32, the procedure described at 302, 303 and 304 is applied.

At 302, the formants are detected in the input audio file and attenuated/amplified (see FIG. 6 and corresponding description for more details) by the formant attenuation/amplification coefficient provided by a neural network 36 from feature values 35 described in more detail in section "Features for inputting to the neural network" below. An example process of determining a weighted spectrum of the audio window is described with regard to FIG. 4 and the corresponding description. An example process of detecting the formants is described in more detail in FIG. 5 and the corresponding description below. An example process of attenuating/amplifying the formants is described in more detail in FIG. 6 and the corresponding description below.

The process 302 of detecting formants in the input audio file 31 and attenuating/amplifying these formants depends on the choice of an equal-loudness-level contour such as an ISO226-2003 contour 21 that is derived from the given loudness parameter (20 in FIG. 2) as described with regard to FIG. 2 above. For example, if the target monitoring loudness is 50 phon, the 50-phon contour will be chosen.

Let $\vec{C}_l$ be the contour at loudness l.

At 303, features 35 are evaluated from the audio in each window 32. The features 35 are described in more detail in section "Features for inputting to the neural network" below. The process 303 of evaluating the features 35 depends on the selected ISO226-2003 Contour $C_l$, i.e on the given monitoring loudness (see FIG. 2).

At 304, for each window, the features (e.g. the values representing these features) are fed to a neural network 36. For example, one forward pass of the neural network 36 produces for each audio window 32 a respective attenuation ratio 37 that is suited to the audio this audio window. As described in more detail with regard to FIG. 7 and in section "Training the neural network" below, the neural network 36 has been trained in advance for this task of evaluating attenuation ratios 37 from input features 35.

At 305, the output audio file 34 is reconstructed from each window 33 of audio generated according to the process of 302.

In the output audio file, $\vec{W}_{proc}(n)$ (33 in FIG. 6) is set as the same position as $\vec{W}_{source}(n)$ (301 in FIG. 3) was in the input file.

In case of overlapping windows, a linear crossfade is used. Linear crossfading is standard procedure in signal processing.

In case $h_{window} < N_{window}$, the windows are overlapping (see 301 in FIG. 3 and corresponding description).

In this case, when setting, $\vec{W}_{proc}(n)$ (33 in FIG. 6) at its position in the output audio file, there exists a section of the output audio file in which non-zero audio samples are already present from a previous $\vec{W}_{proc}(n)$. The length of such an overlapped section is $N_{overlap}$, where $N_{overlap} = N_{window} - h_{window}$.

In this case, the $k^{th}$ sample in the overlapped section corresponding to the $n^{th}$ window, $\vec{S}(n)$, is defined by:

$$\vec{S}(n)[k] = \left(\frac{k}{N_{overlap}}\right) \times \vec{W}_{proc}(n+1)[k] + \left(1 - \left(\frac{k}{N_{overlap}}\right)\right) \times \vec{W}_{proc}(n)[h_{window} + k - 1].$$

Weighting the Spectrum with an Equal-Loudness Contour

Figure 5:
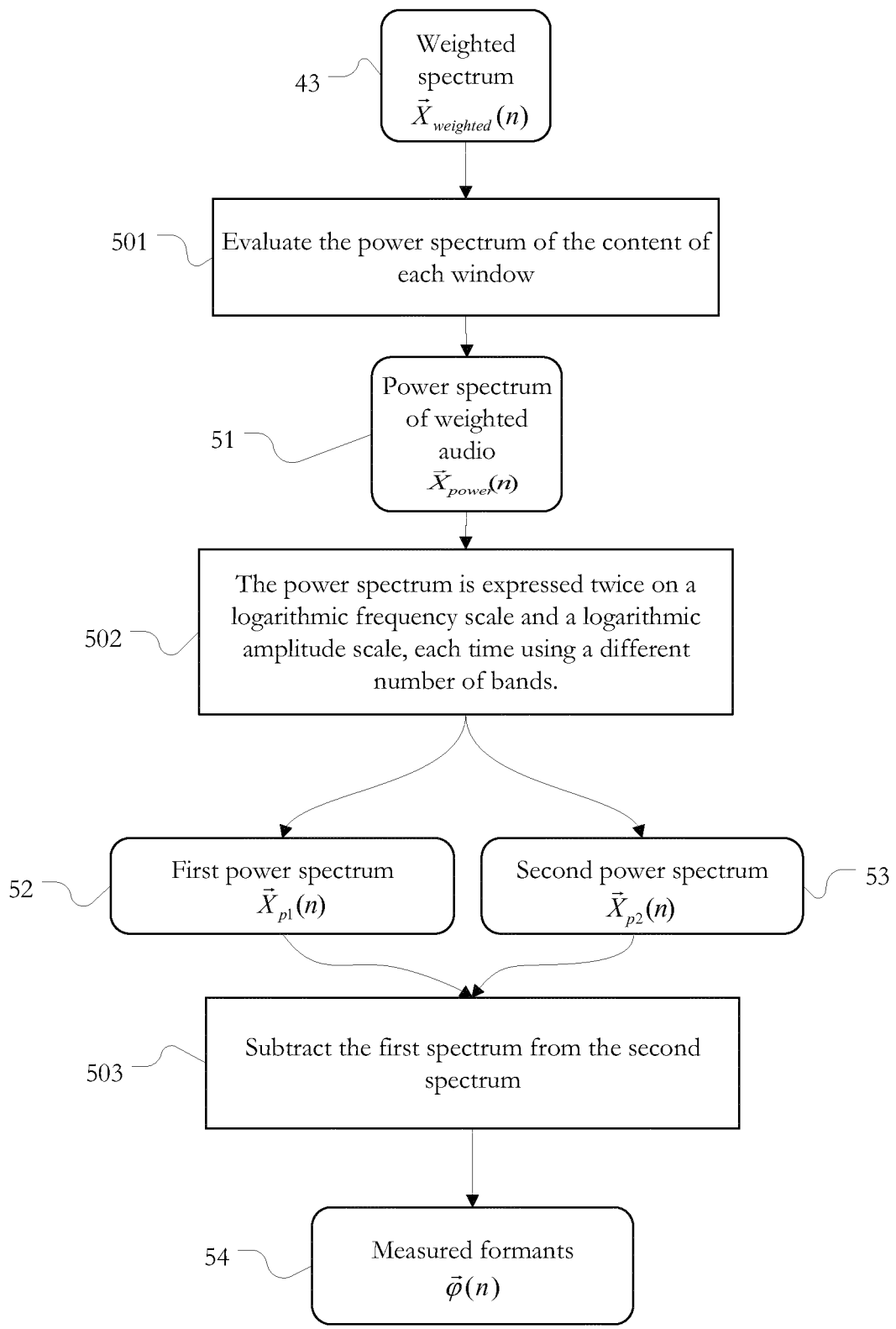
FIG. 5 schematically describes a process of determining the formants from the weighted spectrum.

FIG. 5 schematically describes a process of determining a weighted spectrum of an audio window.

The weighted spectrum 43 is evaluated as follows.

Let "FFT" be the Fast Fourier Transform.

Let "cat" denote the concatenation of two vectors. Let ∘ be the Hadamard (also called "term-by-term" product).

At 401, the Fast Fourier Transform $FFT(\vec{W}_{source}(n))$ of the audio window $\vec{W}_{source}(n)$ is computed.

At 403, the contour $\vec{C}_l$ is interpolated so that its number of elements is $$\frac{N_{window}}{2}.$$

At 404, the contour $\vec{C}_l$ is expressed on a linear scale, with $$\vec{C}_l = 10^{\frac{\vec{C}_l}{20}}.$$

At 405, the contour $\vec{C}_l$ is symmetrized, i.e.

$$\vec{C}_l = cat\left(\vec{C}_l\left[1 \ldots \frac{N_{window}}{2}\right], \vec{C}_l\left[\frac{N_{window}}{2} \ldots 1\right]\right).$$

At 402, the $n^{th}$ weighted spectrum $\vec{X}_{weighted}(n)$ is determined by multiplication as $$\vec{X}_{weighted}(n) = FFT(\vec{W}_{source}(n)) \circ \vec{C}_l.$$

Determining the Formants

FIG. 5 schematically describes a process of determining the formants from the weighted spectrum.

Figure 4:
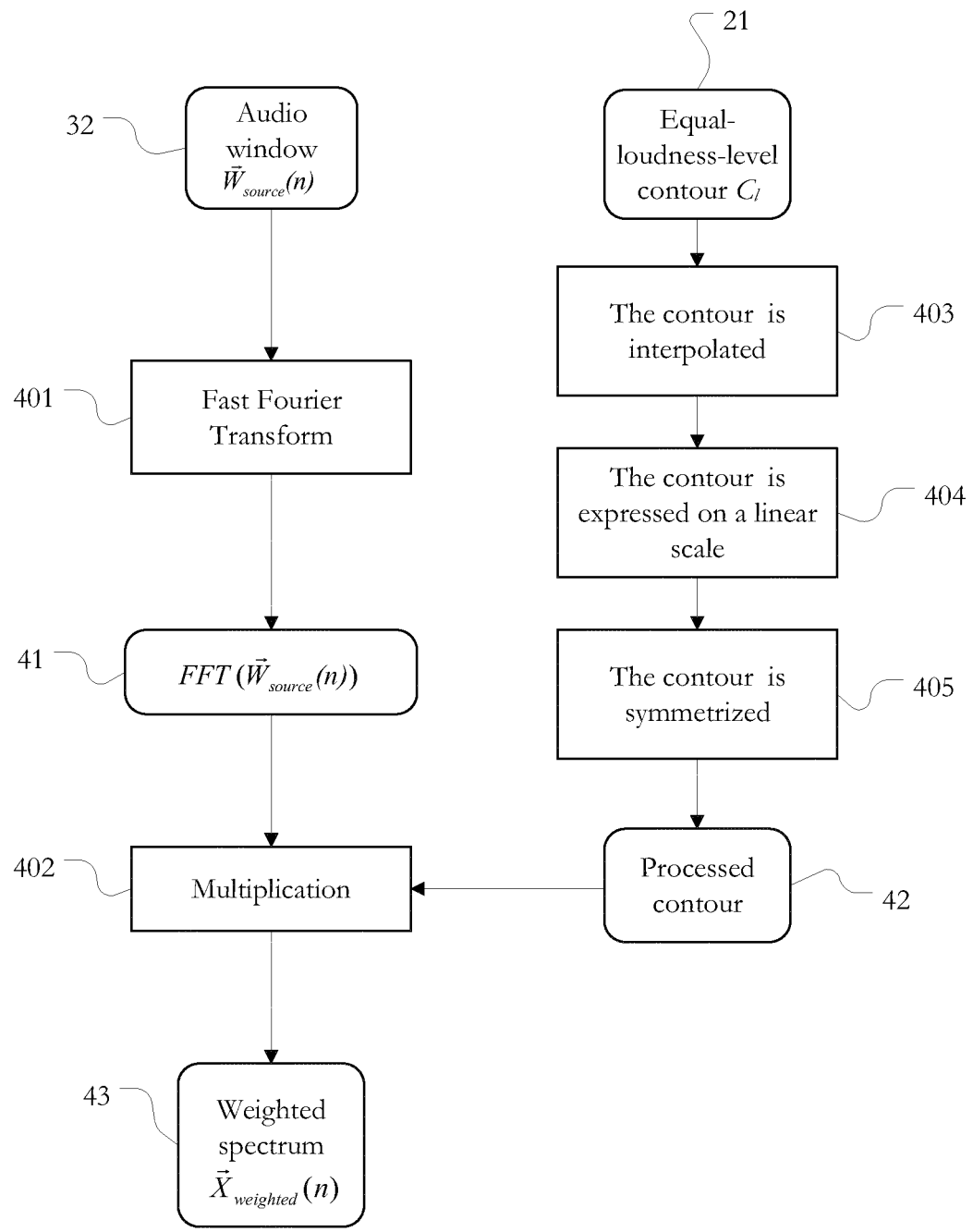
FIG. 4 schematically describes an example process of determining a weighted spectrum of the audio window/file.

At 501, from the weighted spectrum 43 as obtained according to the process of FIG. 4, the power spectrum 51 is evaluated.

The $n^{th}$ power spectrum $\vec{X}_{power}(n)$ is defined as the elements 1 to $N_{window}/2$ of $(\vec{X}_{weighted}(n))^2$.

At 502, the power spectrum is expressed twice on a logarithmic frequency scale and a logarithmic amplitude scale, each time using a different number of bands. The identification of the formants 54 is derived from the difference between one smoothed power spectrum 52 and another smoothed power spectrum 53, the latter being smoothed more than the former, and both being expressed on a logarithmic frequency scale and a logarithmic amplitude scale.

There may be several methods to perform such an operation. The process described here in more detail relies on a solution according to which the spectra are expressed on a logarithmic frequency scale and a logarithmic amplitude scale using a number of discrete bands, with the first spectrum 52 being expressed with less bands than the second spectrum 53. For example, in an exemplary real-time implementation, a first spectrum 52 with 200 bands, and a second spectrum 53 derived from the first with a low-pass filter may be used. In the embodiment described below in more detail, however, for illustrative purpose, a specification using two spectra 52, 53 with bands of different size are used.

The $n^{th}$ power spectrum is expressed in logarithmic amplitude scale as $$\vec{X}_{power}(n) = 20 \times \log 10(\vec{X}_{power}(n)).$$

The following procedure is performed twice to obtain a first power spectrum 52 and a second power spectrum 53, with two different values of $N_{bands}$.

Expression of the $n^{th}$ power spectrum in logarithmic frequency scale is performed as:

A number of $N_{bands}+1$ evenly spaced frequencies on a logarithmic scale are defined by $$f_{log} = logspace\left(\log(20), \log\left(\frac{f_s}{2}\right), N_{bands} + 1\right).$$

Writing $f_{log} = [f_1, f_2, \ldots f_{N_{bands}+1}]$, the $k^{th}$ band is the ensemble of values contained in the interval $[f_k, f_{k+1}]$.

The $k^{th}$ power spectrum value is defined as the mean of the values contained in the $k^{th}$ band.

The power spectrum as expressed on a logarithmic frequency scale and a logarithmic amplitude scale has $N_{bands}$ elements, and is expressed in dB.

This results into two power spectra, $\vec{X}_{p1}(n)$ and $\vec{X}_{p2}(n)$.

An exemplary number of bands is 40 for the first power spectrum 52, and 200 for the second spectrum 53. That is, a typical size for $\vec{X}_{p1}(n)$ may be 40 and a typical size for $\vec{X}_{p2}(n)$ may be 200. These values may be predefined as two configuration parameters of the process.

At 503, the first spectrum is subtracted from the second spectrum. This results into the measured formants 54.

Let $\vec{\varphi}(n)$ be the formant vector for the $n^{th}$ window.

$\vec{\varphi}(n)$ is defined as $\vec{\varphi}(n) = \vec{X}_{p2}(n) - \vec{X}_{p1}(n)$.

Like $\vec{X}_{p1}(n)$ and $\vec{X}_{p2}$, $\vec{\varphi}(n)$ is expressed on a logarithmic frequency scale and a logarithmic amplitude scale.

Attenuating/Amplifying the Formants

Figure 6:
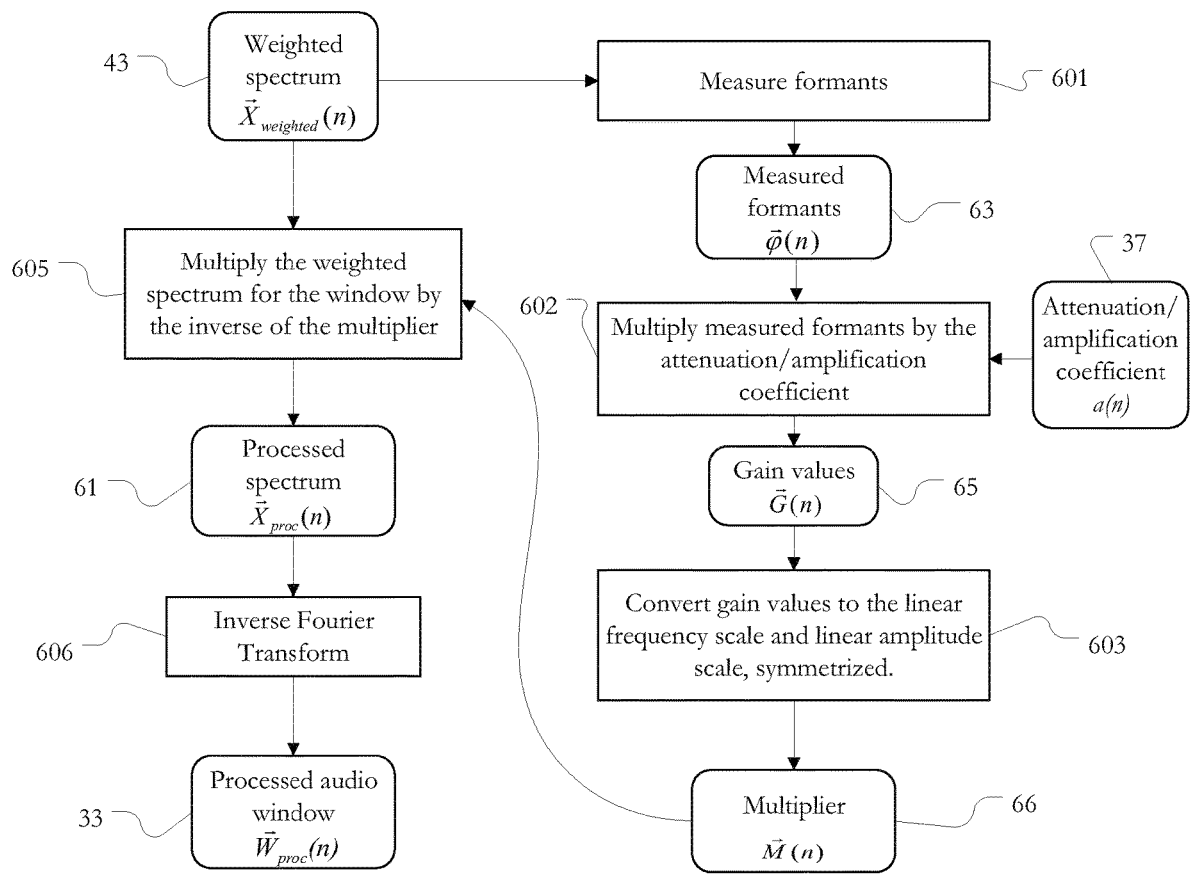
FIG. 6 schematically describes a process of detecting the formants and attenuating/amplifying the formants in each audio window.

FIG. 6 schematically describes the process of detecting the formants and attenuating/amplifying the formants in each audio window.

At 601, the formants are measured as described in more detail with regard to FIG. 5 above. Let $\vec{\varphi}(n)$ be the formant vector for the $n^{th}$ window as obtained according to the process described with regard to FIG. 5.

At 602, the measured formants are multiplied by the formant attenuation/amplification coefficient 37 evaluated in 304 of FIG. 3. This results into the gain values 65.

Let $a(n)$ be the formant attenuation/amplification coefficient 37 for the $n^{th}$ window, with $a(n) \geq 0$. Here, the formant attenuation/amplification coefficient 37 is an attenuation/amplification ratio. Values of $a(n)$ greater than 1 indicate amplification so that the formants are emphasized, values lower than 1 indicate attenuation so that the formants are reduced, and a value of 1 indicates that there is neither attenuation nor amplification so that the formants remain unchanged.

If the attenuation/amplification was set for the whole file in ($\Lambda$7), then $a(n)$ is constant, doesn't depend on n.

Let $\vec{G}(n)$ be the gain vector 65 for the $n^{th}$ window.

$\vec{G}(n)$ is defined as $\vec{G}(n) = a(n) \times \vec{\varphi}(n)$.

As there is one single formant attenuation/amplification coefficient 37 for each window, the process conserves the input audio file's overall profile.

At 603, the gain values 65 are converted to the linear frequency scale and linear amplitude scale, symmetrized. The result is inverted to obtain a multiplier 66.

Let this "multiplier" 66 for the $n^{th}$ window be noted $\vec{M}(n)$.

$\vec{M}(n)$ is defined as being the interpolation of the gain vector $\vec{G}(n)$ on a linear frequency scale, using $$\frac{N_{window}}{2}$$

elements.

The multiplier $\vec{M}(n)$ is expressed on a linear amplitude scale, with $$\vec{M}(n) = 10^{\frac{\vec{M}(n)}{20}}.$$

The multiplier $\vec{M}(n)$ is symmetrized, i.e. $\vec{M}(n)=$ $$cat\left(\vec{M}(n)\left[1 \ldots \frac{N_{window}}{2}\right], \vec{M}(n)\left[\frac{N_{window}}{2} \ldots 1\right]\right).$$

The multiplier $\vec{M}(n)$ has now $N_{window}$ elements.

The multiplier $\vec{M}(n)$ is inverted, with $\vec{M}(n) = 1/\vec{M}(n)$.

Due to the nature of the process in 503 of FIG. 5, $\vec{G}(n)$ evolves between ca. +15 dB and ca. −5 dB.

This means the denominator in $1/\vec{M}(n)$ is never close to zero, and therefore the result never diverges.

At 605, the complex spectrum 43 for the window obtained according to the process described with regard to FIG. 4 is multiplied by the inverse $1/\vec{M}(n)$ of the multiplier $\vec{M}(n)$. This results into the processed spectrum 61.

Let $\vec{X}_{proc}(n)$ be the processed spectrum 61 for the $n^{th}$ window.

Let ○ be the Hadamard product.

$\vec{X}_{proc}(n)$ is defined by $\vec{X}_{proc}(n) = \vec{M}(n) \circ FFT(\vec{W}_{source}(n))$.

At 606, the processed spectrum 61 is transformed back into the time domain using an inverse discrete Fourier transform. This results into the processed audio 33.

Let iFFT be the inverse fast Fourier transform.

Let $\vec{W}_{proc}(n)$ be the processed audio content 33 for the $n^{th}$ window.

$\vec{W}_{proc}(n)$ is defined as $\vec{W}_{proc}(n) = iFFT(\vec{X}_{proc}(n))$.

If some imaginary residue remains in $\vec{W}_{proc}(n)$, then $\vec{W}_{proc}(n) = real(\vec{W}_{proc}(n))$.

Processing of a Stereo File

In the following, a stereo version of the processes is described.

The stereo version of the process evaluates the mean between the spectra for the two channels and uses this mean to evaluate the formants. This avoids the damaging of the stereo image done by the processing of each channel by the mono version.

The process starts from a stereo input audio file and results into a stereo input audio file.

Let $\vec{S}_L$ and $\vec{S}_R$ be the input audio file. Let $f_s$ be its sampling frequency.

Let $N_{whole}$ be the number of samples on the audio file.

The choice of an equal-loudness-level contour such as an ISO226-2003 contour is derived from the given loudness as described with regard to FIG. 2. As with regard to the mono version of the processes, let $\vec{C}_l$ be the contour at loudness l.

Both channels of the stereo input file are windowed, resulting into a sequence of possibly overlapping windows containing audio.

Let the $n^{th}$ windows be written $\vec{W}_L(n)$ and $\vec{W}_R(n)$.

$N_{window}$ is the length of each window and $h_{window}$ is the hop size, with $h_{window} \leq N_{window}$, as defined in the mono version of the process.

The $n^{th}$ windows $\vec{W}_L(n)$ and $\vec{W}_R(n)$ contain the audio samples $1+((n-1) \times h_{window})$ to $N_{window}+((n-1) \times h_{window})$ from $\vec{S}_L$ and $\vec{S}_R$ respectively.

For the audio in each window, the procedure described with regard to FIGS. 3 to 6 are applied, taking into account the modifications for a stereo file as described below.

Features (35 in FIG. 3) as described in section "Features for inputting to the neural network" below are evaluated from the audio in each window. The values for these features are fed to the neural network (36 in FIG. 3). For example, one forward pass of the neural network may produce the attenuation ratio (37 in FIG. 3) that is suited to the audio according to the training performed as described in section "Training the neural network" below.

The weighted spectrum is evaluated for both channels.

The $n^{th}$ weighted spectrum $\vec{X}_{wL}(n)$ is defined as $\vec{X}_{wL}(n)=FFT(\vec{W}_L(n)) \circ \vec{C}_l$.

The $n^{th}$ weighted spectrum $\vec{X}_{wR}(n)$ is defined as $\vec{X}_{wR}(n)=FFT(\vec{W}_R(n)) \circ \vec{C}_l$.

From the weighted spectra, the power spectra are evaluated.

The $n^{th}$ power spectrum $\vec{X}_{pL}(n)$ is defined as the elements 1 to $N_{window}/2$ of $(\vec{X}_{wL}(n))^2$.

The $n^{th}$ power spectrum $\vec{X}_{pR}(n)$ is defined as the elements 1 to $N_{window}/2$ of $(\vec{X}_{wR}(n))^2$.

The mean of the two power spectra in the linear domain is evaluated.

The $n^{th}$ power spectrum $\vec{X}_{power}(n)$ is defined as $\vec{X}_p(n)=0.5\times(\vec{X}_{pL}(n)+\vec{X}_{pR}(n))$.

The identification of the formants is derived from the difference between one smoothed power spectrum and another smoothed power spectrum, the latter being smoothed more than the former, and both being expressed on a logarithmic frequency scale and a logarithmic amplitude scale. This process is identical to the respective process in the mono version described with regard to FIG. 5, resulting into two power spectra, $\vec{X}_{p1}(n)$ and $\vec{X}_{p2}(n)$.

The first spectrum is subtracted from the second spectrum. This results into the measured formants $\vec{\varphi}(n)$. The measured formants are multiplied by the formant attenuation/amplification coefficient evaluated in 304 of FIG. 3. This results into the gain values $\vec{G}(n)$. The gain values are converted to the linear frequency scale and linear amplitude scale, symmetrized. The result is inverted. This results in the multiplier $\vec{M}(n)$. These processes are again identical to the respective processes in the mono version.

The complex spectra for the left and right window are multiplied by the inverse of the multiplier. This results into the processed spectrum.

Let $\vec{X}_{procL}(n)$ and let $\vec{X}_{procR}(n)$ be the processed spectra for the $n^{th}$ window.

The $n^{th}$ left processed spectrum $\vec{X}_{procL}(n)$ is defined as $\vec{X}_{procL}(n)=FFT(\vec{W}_L(n)) \circ \vec{M}(n)$.

The $n^{th}$ right processed spectrum $\vec{X}_{procR}(n)$ is defined as $\vec{X}_{procR}(n)=FFT(\vec{W}_R(n)) \circ \vec{M}(n)$.

The processed spectrum is transformed back into the time domain using an inverse discrete Fourier transform. This results into the processed audio.

Let $\overrightarrow{W_{procL}}(n)$ and $\overrightarrow{W_{procR}}(n)$ be the processed audio contents for the $n^{th}$ window.

$\overrightarrow{W_{procL}}(n)$ is defined as $\overrightarrow{W_{procL}}(n)=iFFT(\vec{X}_{procL}(n))$.

$\overrightarrow{W_{procR}}(n)$ is defined as $\overrightarrow{W_{procR}}(n)=iFFT(\vec{X}_{procR}(n))$.

If some imaginary residue remains in $\overrightarrow{W_{procL}}(n)$, then $\overrightarrow{W_{procL}}(n)=real(\overrightarrow{W_{procL}}(n))$.

If some imaginary residue remains in $\overrightarrow{W_{procR}}(n)$, then $\overrightarrow{W_{procR}}(n)=real(\overrightarrow{W_{procR}}(n))$.

As described with regard to 305 of FIG. 3, the output audio file is reconstructed from each window of audio generated in 302 of FIG. 3.

In the output audio file, $\overrightarrow{W_{procL}}(n)$ is set as the same position as $\overrightarrow{W_L}(n)$ was in the input file.

In the output audio file, $\overrightarrow{W_{procL}}(n)$ is set as the same position as $\overrightarrow{W_L}(n)$ was in the input file.

In case of overlapping windows, a linear crossfade is used for each channel, as it is described with regard to the mono version of the process.

Training the Neural Network

Figure 7:
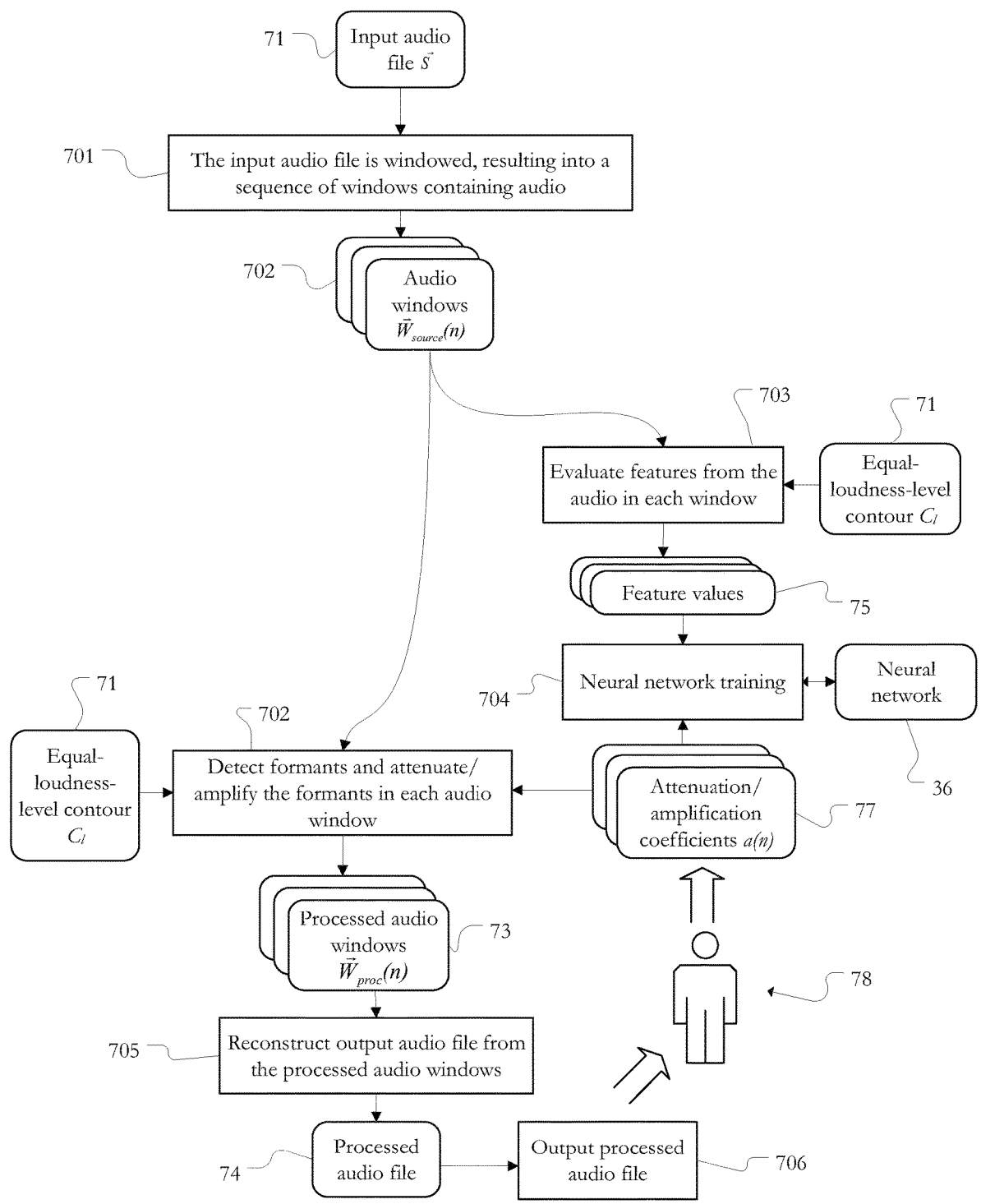
FIG. 7 schematically describes an exemplifying process of training a neural network on the basis of a dataset of audio files.

FIG. 7 schematically describes an exemplifying process of training a neural network on the basis of a dataset of audio files.

The process of training the neural network as described with regard to FIG. 7 corresponds to some extent to the process described with regard to FIG. 3 and the corresponding description, so that, here, only the differences are explained in more detail.

A dataset of audio files is gathered and provided as basis for the training process. The training process described below is performed with each audio file 31 from the gathered dataset of audio files.

At 703, features 51 are extracted from each audio file 31 in the dataset. An example set of features is detailed in section "Features" below. Other sets of features are possible.

For each input audio file, the features in obtained at 703 may be evaluated either on the entire file, or on the windowed file.

In the embodiment of FIG. 7, windowing is performed at 701. The windowing process may for example be performed as set out with regard to 301 in FIG. 3.

At 702, each audio window (or file) 702 is fed into an audio process that detects and attenuates/amplifies its spectral formants. The process possesses one accessible parameter, the formant attenuation/amplification coefficient 77 and corresponds to the process described with regard to 301 in FIG. 3. An example process of determining a weighted spectrum of the audio window/file is described with regard to FIG. 4 and the corresponding description. An example process of detecting the formants is described in more detail in FIG. 5 and the corresponding description. An example process of attenuating/amplifying the formants is described in more detail in FIG. 6 and the corresponding description below.

For each audio file, given a target loudness and corresponding equal-loudness-level contour 71 (see FIG. 2 and the corresponding description).

For each window/file, the formant attenuation/amplification coefficient 77 is manually set by a human subject 78 so that the result, the processed audio file 74, appears the best sounding possible to the subject 78. The ensemble of such results (attenuation/amplification values for audio windows 702) is referred to as the "ground truth". In order to allow the human subject 78 to evaluate the quality of the result 74, the processed audio file 74 is output, at 706, to the human subject 78, e.g. by a headphone unit or loudspeaker.

For each audio file, the parameters may be set either for the entire audio file, or may evolve dynamically during the course of the audio file.

At 704, given an equal-loudness-level contour 71 for a predetermined target loudness (20 in FIG. 2), a neural network 36 is trained with the feature values 75 obtained in 703 as an input, and the ground truth 77 evaluated by the human operator 78 as an output.

One possible configuration for a neural network 36 trained in 704 is a three-layer network with the following characteristics. The two first layers use ReLU as an activation function, the last layer uses a sigmoid as an activation function. If the number of input descriptors is $N_{in}$, then the hidden layer has $1.5 \times N_{in}$ inputs and $N_{in}$ outputs. The loss function is the mean square error. According to an example, the gradient descent may be stochastic, using a batch size of 4000. The learning rate may be 0.3. The model may be trained for 50000 epochs.

Other configurations may be possible.

Given an equal-loudness-level contour (21 in FIG. 2) for a predetermined target loudness (20 in FIG. 2), once trained, the neural network 36 is able to generate an attenuation/amplification ratio (37 in FIG. 3), so that the attenuation/amplification of the formants of an input audio file (31 in FIG. 3) performed with the process of FIG. 3 results in an optimal-sounding audio file (34 in FIG. 3) according to the training by the human subject 78. That is, the trained neural network may be used as the neural network (36 in FIG. 3) of the process described with regard to FIG. 3.

Features for Inputting to the Neural Network

In the following, some example for features that may be used as input for a neural network are described in more detail. These features are derived from an input audio file (31 in FIG. 3, 71 in FIG. 7) as described with regard to the features (35 in FIG. 3, and features 75 in FIG. 7) used in the processes described in FIGS. 3 and 7.

Given the nature of neural networks, using different features may provide a similar result.

Each feature described below may be one input of the neural network. The features may also be combined to generate be one input of the neural network.

If the feature is windowed, then each window is an input vector for the neural network.

(F1) Formants

According to a first embodiment, the measure of the amplitude of the formants, as measured by the process of FIG. 5 is used as features for inputting to the neural network. That is the formant vector $\vec{\varphi}(n)$ as obtained by process steps 501, 502 and 503 of FIG. 5 may be used as features for inputting to the neural network, or the formants expressed on a logarithmic amplitude scale and on a logarithmic frequency scale may be fed to the neural network $\vec{\varphi}(n) = 20 \times \log 10(\vec{\varphi}(n))$.

(F2) Spectral Flatness or Wiener Entropy

According to a further embodiment, the measure of spectral flatness or Wiener entropy is used as feature for inputting to the neural network. It consists in the geometric mean of the power spectrum, divided by the arithmetic mean of the power spectrum. This is a one-dimension feature. In case of a stereo file, the result is the mean of the two flatness values.

The following provides the measure for one window, one channel.

Let "FFT" be the Fast Fourier Transform.

Let $\vec{W}_{source}$ be the input audio.

Let $N_{window}$ be the number of elements in $\vec{W}_{source}$.

The spectrum $\vec{X}$ is defined as $\vec{X} = FFT(\vec{W}_{source})$.

The power spectrum $\vec{X}_{power}$ is defined as the elements 1 to $N_{window}/2$ of $(\vec{X}_{weighted})^2$.

The spectral flatness is F, where $$F = \frac{\sqrt[N_{window}/2]{\Pi \vec{X}_{power}}}{\frac{1}{N_{window}/2} \times \Sigma \vec{X}_{power}}.$$

(F3) Values of the Power Spectrum

It may be useful to include the values of the power spectrum, expressed on a logarithmic frequency scale and a logarithmic amplitude scale. The measure can be windowed or global.

The power spectrum $\vec{X}_{power}$ as described with regard to 51 in FIG. 5 or the power spectrum expressed on a logarithmic amplitude scale as $\vec{X}_{power} = 20 \times \log 10(\vec{X}_{power})$ may be bused as feature.

(F4) Crest Factor

According to a further embodiment, a measure which can be used for feeding the neural network is the crest factor (a feature related to dynamics). It is defined, for a window of ca. 0.5 s, as the ratio between the root mean square of the signal and its peak.

Let $\vec{W}_{source}$ be the input audio.

Let $N_{window}$ be the number of elements in $\vec{W}_{source}$.

The crest factor "CF" is defined as $$CF = \frac{RMS(\vec{W}_{source})}{\max(abs(\vec{W}_{source}))},$$

with more details $$CF = \frac{\sqrt{\Sigma \vec{W}_{source}^2 / \vec{W}_{source}}}{\max(|\vec{W}_{source}|)}.$$

Illustration of Results

FIG. 8a-d provide examples of results of the formant detection and attenuation processes described above (see 302 in FIG. 3) for three illustrative formant attenuation/amplification coefficients, 0, 0.5, and 1.0.

Figure 8A:
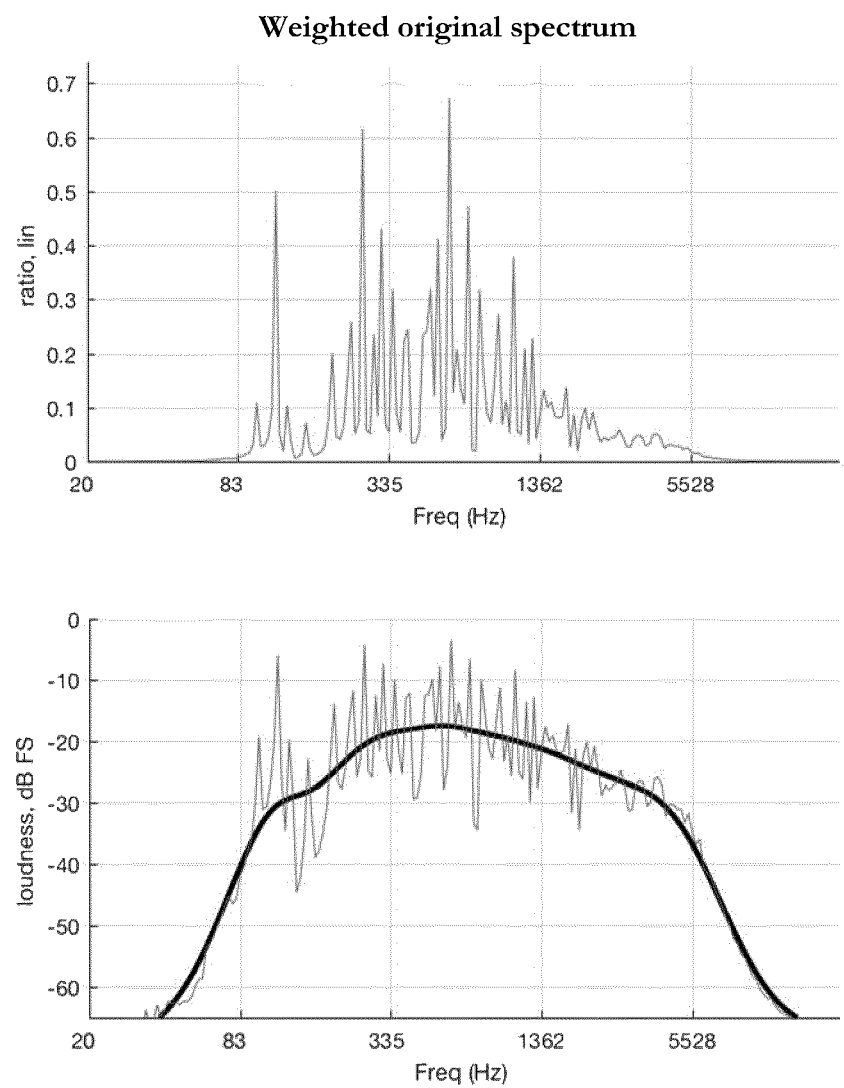
FIG. 8a provides an example of a weighted original spectrum on a linear amplitude scale and a logarithmic frequency scale (upper graph) and on a logarithmic amplitude scale and a logarithmic frequency scale (lower graph)

FIG. 8a provides an example of a weighted original spectrum on a linear amplitude scale and a logarithmic frequency scale (upper graph) and on a logarithmic amplitude scale and a logarithmic frequency scale (lower graph). The weighted original spectrum as displayed in FIG. 8a corresponds to weighted spectrum $\vec{X}_{weighted}(n)$ (43 in FIG. 5) as described in the process description above.

Figure 8B:
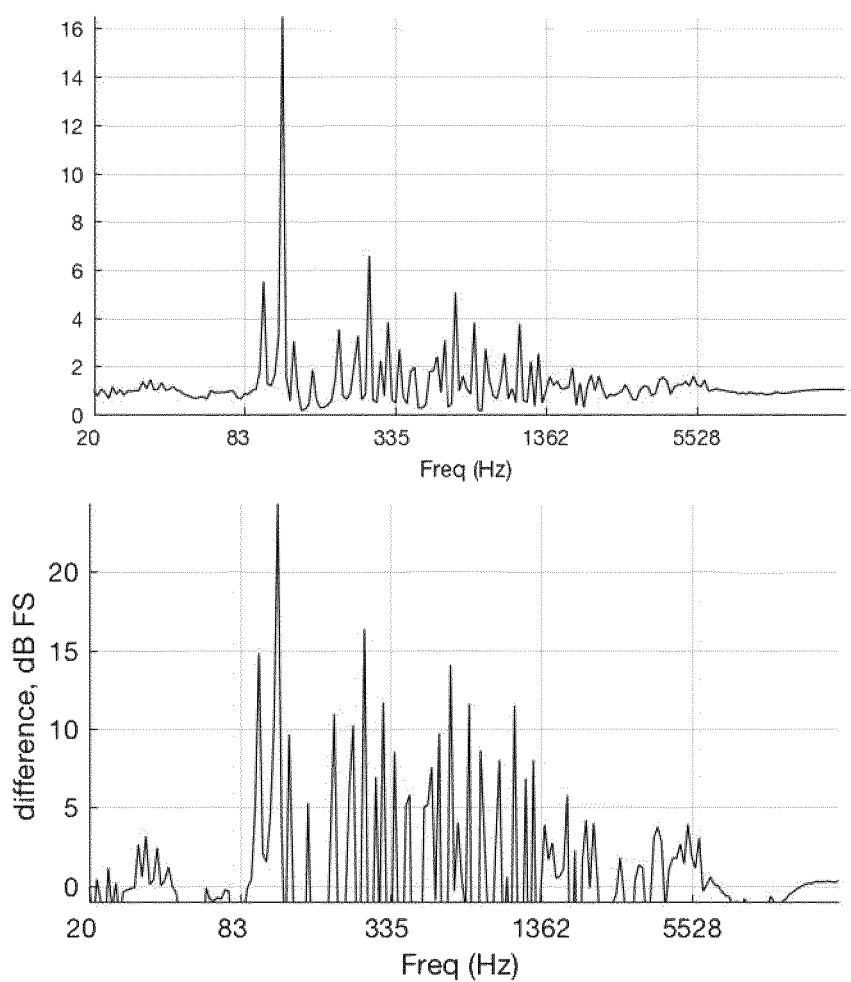
FIG. 8b provides the result of the formant measurement process applied to the example spectrum displayed in FIG. 8a on a linear amplitude scale (upper graph) and on a logarithmic amplitude scale (lower graph)

FIG. 8b provides the result of the formant measurement process applied to the example spectrum displayed in FIG. 8a on a linear amplitude scale (upper graph) and on a logarithmic amplitude scale (lower graph). The result of the formant measurement process in FIG. 8b corresponds to the the measured formants $\vec{\varphi}(n)$ (54 in FIG. 5) as obtained from the weighted spectrum $\vec{X}_{weighted}(n)$ (43 in FIG. 5) according to the process described above.

Figure 8C:
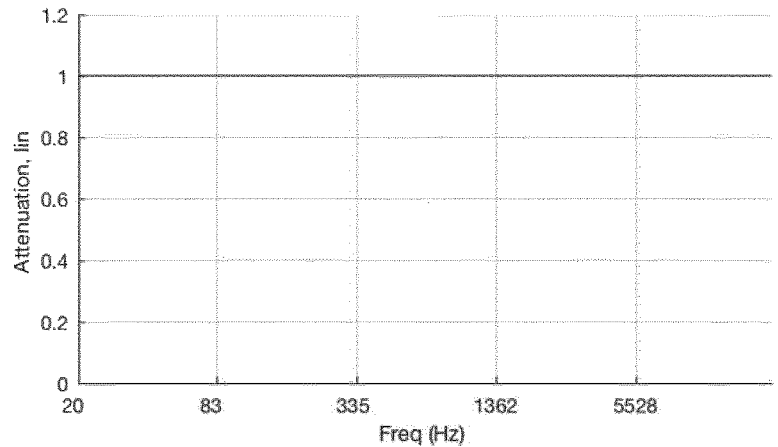
FIG. 8c provides the amplification obtained from the example spectrum displayed in FIG. 8a for three different formant attenuation/amplification coefficients, 0, 0.5, and 1.0.
Figure 8C:
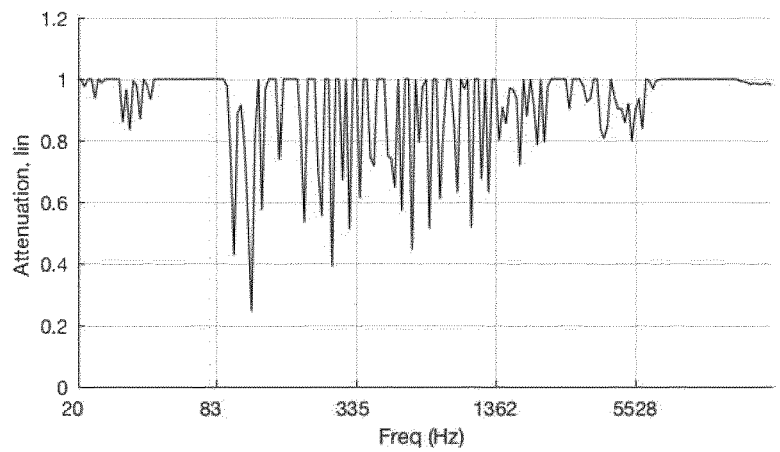
Figure 8C:
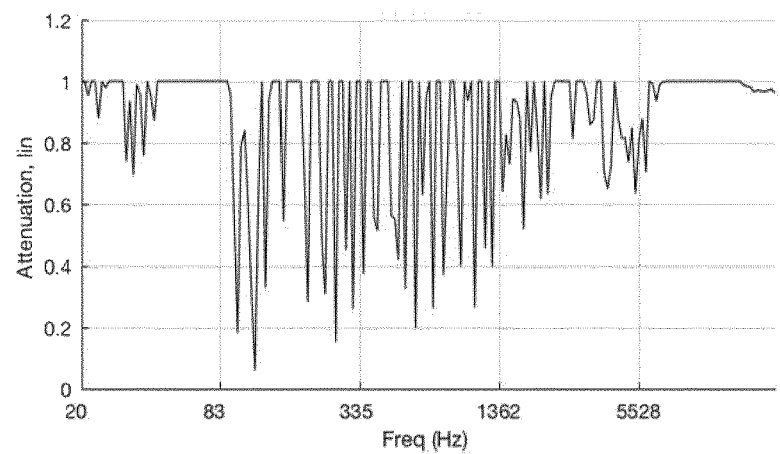

FIG. 8c provides the attenuation obtained from the example spectrum displayed in FIG. 8a for three different formant attenuation/amplification coefficients, 0, 0.5, and 1.0. The attenuation is shown on the y-axis as the multiplier $\vec{M}(n)$ (66 in FIG. 6) which is obtained by multiplying the measured formants according to FIG. 8b by the formant attenuation/amplification coefficient, here 0, 0.5, and, respectively, 1.0.

Figure 8D:
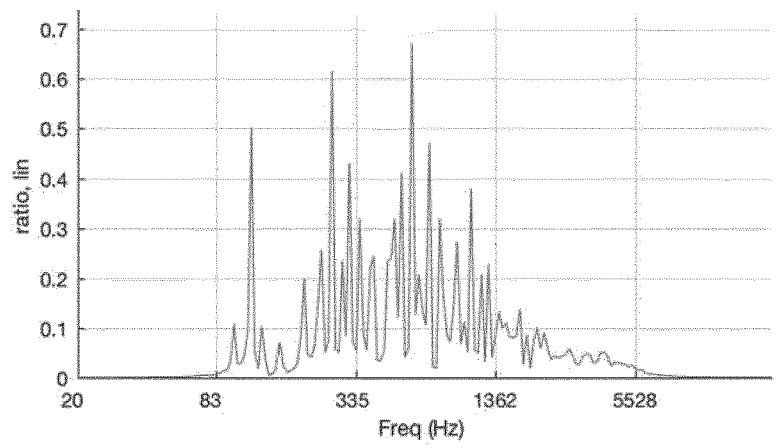
FIG. 8d provides the processed spectrum obtained from the example spectrum displayed in FIG. 8a for three different formant attenuation/amplification coefficients, 0, 0.5, and 1.0.
Figure 8D:
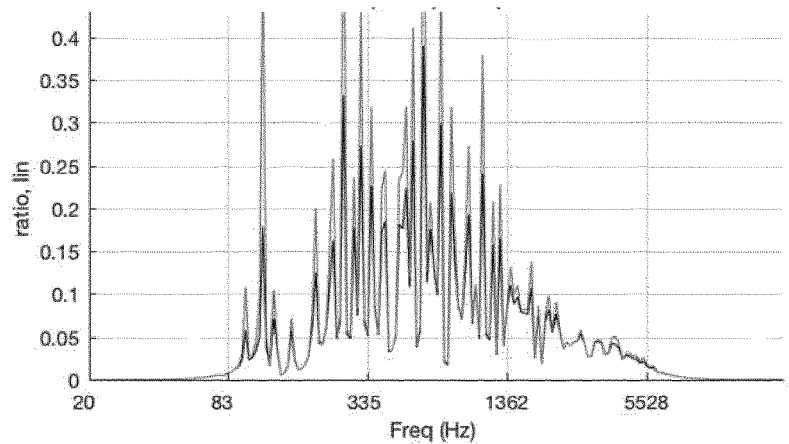
Figure 8D:
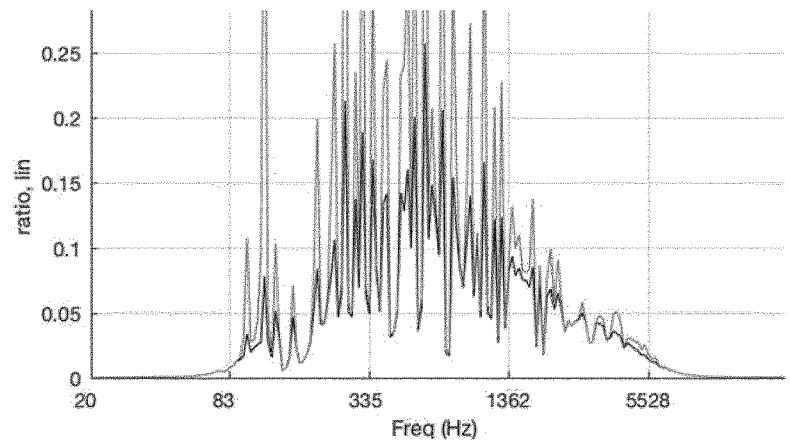

FIG. 8d provides the processed spectrum obtained from the example spectrum displayed in FIG. 8a for three different formant attenuation/amplification coefficients, 0, 0.5, and 1.0. The processed spectrum displayed in FIG. 8d corresponds to processed spectrum $\vec{X}_{proc}(n)$ (61 of FIG. 6) which is obtained by multiplying the weighted spectrum for the window by the inverse of the multiplier displayed in FIG. 8c. Formant attenuation/amplification coefficient 0 (transparent) results in the spectrum being not attenuated/amplified, so that the processed spectrum is identical to the original spectrum.

Implementation

In the following, an embodiment of an electronic device 930 is described under reference of FIG. 9. The electronic device, here a computer 930, can be implemented such that it can basically function as any type of audio processing apparatus or audio processing entity described herein. The computer has components 931 to 940, which can form a circuitry, such as any one of the circuitries of an audio processing device.

Embodiments which use software, firmware, programs, plugins or the like for performing the processes as described herein can be installed on computer 930, which is then configured to be suitable for the embodiment.

The computer 930 has a CPU 931 (Central Processing Unit), which can execute various types of procedures and methods as described herein, for example, in accordance with programs stored in a read-only memory (ROM) 932, stored in a storage 937 and loaded into a random access memory (RAM) 933, stored on a medium 940, which can be inserted in a respective drive 939, etc.

The CPU 931, the ROM 932 and the RAM 933 are connected with a bus 941, which in turn is connected to an input/output interface 934. The number of CPUs, memories and storages is only exemplary, and the skilled person will appreciate that the computer 930 can be adapted and configured accordingly for meeting specific requirements which arise when it functions as a base station, and user equipment.

At the input/output interface 934, several components are connected: an input 935, an output 936, the storage 837, a communication interface 938 and the drive 939, into which a medium 940 (compact disc, digital video disc, compact flash memory, or the like) can be inserted.

The input 935 can be a pointer device (mouse, graphic table, or the like), a keyboard, a microphone, a camera, a touchscreen, etc.

The output 936 can have a display (liquid crystal display, cathode ray tube display, light emittance diode display, etc.), loudspeakers, etc.

The storage 937 can have a hard disk, a solid state drive and the like.

The communication interface 938 can be adapted to communicate, for example, via a local area network (LAN), wireless local area network (WLAN), mobile telecommunications system (GSM, UMTS, LTE, etc.), Bluetooth, infrared, etc.

It should be noted that the description above only pertains to an example configuration of computer 930. Alternative configurations may be implemented with additional or other sensors, storage devices, interfaces or the like. For example, the communication interface 938 may support other radio access technologies than the mentioned WLAN, GSM, UMTS and LTE.

The methods as described herein are also implemented in some embodiments as a computer program causing a computer and/or a processor and/or a circuitry to perform the method, when being carried out on the computer and/or processor and/or circuitry. In some embodiments, also a non-transitory computer-readable recording medium is provided that stores therein a computer program product, which, when executed by a processor/circuitry, such as the processor/circuitry described above, causes the methods described herein to be performed.

It should be recognized that the embodiments describe methods with an exemplary ordering of method steps. The specific ordering of method steps is, however, given for illustrative purposes only and should not be construed as binding. For example, in the process of FIG. 3, first the source audio file 31 is windowed at 301, resulting into a sequence of windows 51 containing audio, and then each window is weighted at 303 using the ISO226-2003 contour. The skilled person will readily appreciate that the order of these steps can be reversed. That is, in an alternative embodiment the source audio file 31 is first is weighted using the ISO226-2003 contour and then the resulting weighted source audio file is windowed.

Figure 9:
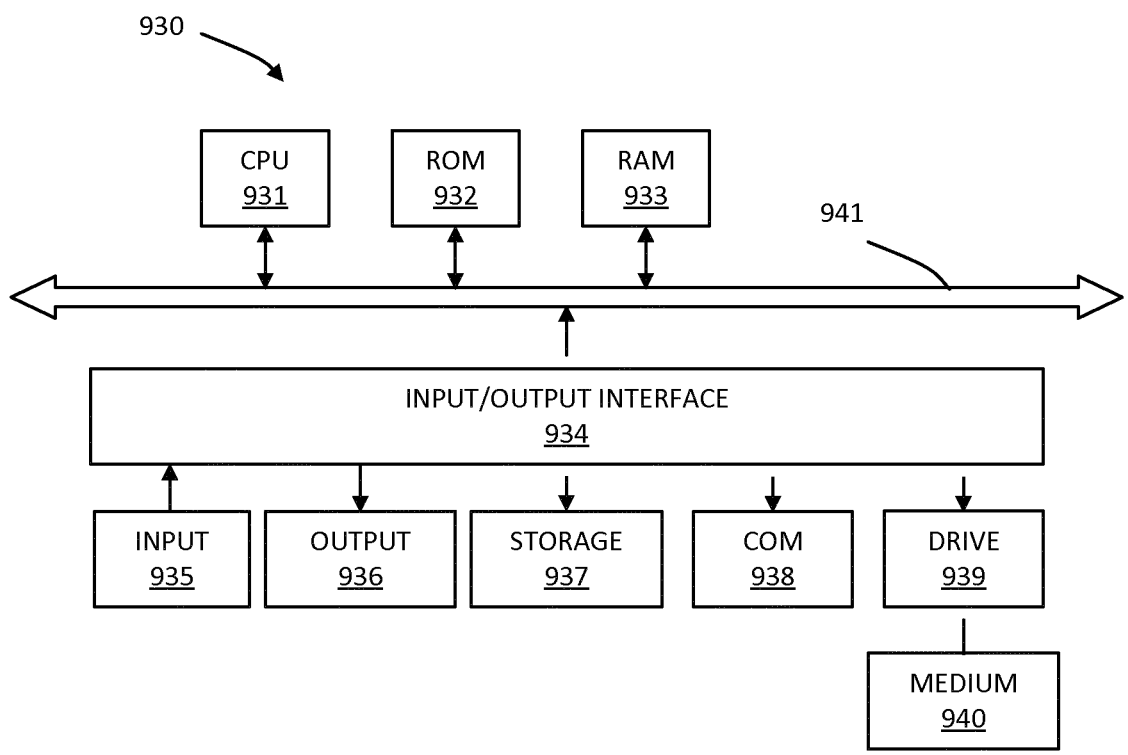
FIG. 9 schematically describes an embodiment of an electronic device for implementing the processes.

It should also be noted that the division of the control or circuitry of FIG. 9 into units 931 to 940 is only made for illustration purposes and that the present disclosure is not limited to any specific division of functions in specific units. For instance, at least parts of the circuitry could be implemented by a respective programmed processor, field programmable gate array (FPGA), dedicated circuits, and the like.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below:

[1] A method comprising determining (303) feature values (35) of an input audio window (32) and determining a formant attenuation/amplification coefficient (37) for the input audio window (32) based on the processing of the feature values (35) by a neural network (36).

[2] The method of [1], comprising determining (501, 502, 503) formants (54) of the input audio window (32) and multiplying the formants (32) with the formant attenuation/ amplification coefficient (37).

[3] The method of [2], in which the formants are automatically set to an optimal value for a given loudness.

[4] The method of [2] or [3], in which multiplying the formants (32) with the formant attenuation/amplification coefficient (37) conserves the input audio file's overall spectral profile.

[5] The method of anyone of [2] to [4], wherein determining (501, 502, 503) formants (54) of the input audio window (32) comprises determining the difference of two power spectra, one smoothed power spectrum and another smoothed power spectrum, one power spectrum being smoothed more than the other power spectrum.

[6] The method of anyone of [2] to [5], wherein determining (501, 502, 503) formants (54) of the input audio window (32) comprises determining (502) a first power spectrum (52) and a second power spectrum (53) using a different number of bands for the first power spectrum (52) and the second power spectrum (53).

[7] The method of anyone of [1] to [6], comprising determining a weighted spectrum (43) from the input audio window (32) and multiplying (605) the weighted spectrum (43) with a multiplier (66) that depends on the formant attenuation/amplification coefficient (37).

[8] The method of [7], wherein determining a weighted spectrum (43) from the input audio window (32) comprises weighting the input audio window (32) with an equal-loudness-level contour (21).

[9] The method of [8], further comprising selecting the equal-loudness-level contour (21) based on a target monitoring loudness (20).

[10] The method of [8] or [9], wherein weighting the input audio window (32) with an equal-loudness-level contour (21) comprises transforming (401) the input audio window (32) to the spectral domain and multiplying the obtained spectrum with a processed equal-loudness-level contour (42).

[11] The method of anyone of [1] to [10], wherein the features (35) comprise the amplitude of formants (54) of the input audio window (32).

[12] The method of anyone of [1] to [11], wherein the features (35) comprise the spectral flatness or Wiener entropy of the power spectrum (51) of the input audio window (32).

[13] The method of anyone of [1] to [12], wherein the features (35) comprise values of the power spectrum (51) of the input audio window (32).

[14] The method of anyone of [1] to [13], wherein the features (35) comprise a crest factor of the input audio window (32).

[15] The method of anyone of [1] to [14], wherein the neural network (36) is trained in advance with a collection of input audio windows by manually setting, for each window, the formant formant attenuation/amplification coefficient so that the processed audio window appears the best sounding possible.

[16] An electronic device comprising circuitry configured to perform the method of anyone of [1] to [15].

[17] A computer program comprising instructions, which when executed on a processor cause the processor to perform the method of anyone of [1] to [15].

REFERENCES

[Unfilter] http:/www.zynaptiq.com/unfilter/

[ISO226-2003] International Standard ISO 226, Second edition, 15 Aug. 2003, Acoustics—Normal equal-loudness-level"

[Lartillot 2014] Olivier Lartillot, "MIRtoolbox 1.6.1 User's Manual", Aalborg University, Denmark, Department of Architecture, Design and Media Technology, Dec. 7, 2014

The invention claimed is:

1. A method comprising:
windowing an input audio file to generate an input audio window;
determining feature values of the input audio window;
determining formants of the input audio window;
automatically determining a single formant attenuation/amplification coefficient for the input audio window based on the processing of the feature values by a neural network, wherein the neural network sets formant attenuation/amplification coefficients in accordance with a target loudness; and
multiplying the formants with the single formant attenuation/amplification coefficient to generate a gain for the input audio window.

2. The method of claim 1, wherein the neural network sets the formants to an optimal value for the target loudness.

3. The method of claim 1, in which multiplying the formants with the single formant attenuation/amplification coefficient conserves the input audio file's overall spectral profile.

4. The method of claim 1, wherein determining formants of the input audio window comprises determining the difference of two power spectra, one smoothed power spectrum and another smoothed power spectrum, one power spectrum being smoothed more than the other power spectrum.

5. The method of claim 1, wherein determining formants of the input audio window comprises determining a first power spectrum and a second power spectrum using a different number of bands for the first power spectrum and the second power spectrum.

6. The method of claim 1, comprising determining a weighted spectrum from the input audio window and multiplying the weighted spectrum with a multiplier that depends on the single formant attenuation/amplification coefficient.

7. The method of claim 6, wherein determining a weighted spectrum from the input audio window comprises weighting the input audio window with an equal-loudness-level contour.

8. The method of claim 7, further comprising selecting the equal-loudness-level contour based on a target monitoting loudness.

9. The method of claim 7, wherein weighting the input audio window with an equal-loudness-level contour comprises transforming the input audio window to the spectral domain and multiplying the obtained spectrum with a processed equal-loudness-level contour.

10. The method of claim 1, wherein the features comprise the amplitude of formants of the input audio window.

11. The method of claim 1, wherein the features comprise the spectral flatness or Wiener entropy of the power spectrum of the input audio window.

12. The method of claim 1, wherein the features comprise values of the power spectrum of the input audio window.

13. The method of claim 1, wherein the features comprise a crest factor of the input audio window.

14. The method of claim 1, wherein the neural network is trained in advance with a collection of input audio windows by manually setting, for each window, the single formant attenuation/amplification coefficient so that the processed audio window appears the best sounding possible.

15. An electronic device comprising:
circuitry configured to
window an input audio file to generate an input audio window;
determine feature values of the input audio window;
determine formants of the input audio window;
automatically determine a single formant attenuation/amplification coefficient for the input audio window based on the processing of the feature values by a neural network, wherein the neural network sets fortnant attenuation/amplification coefficients in accordance with a target loudness; and
multiply the formants with the single formant attenuation/amplification coefficient to generate a gain for the input audio window.

16. The electronic device of claim 15, wherein the window of the input audio file generates a plurality of sequential input audio windows, each of which is subject to operations as the input audio window.

17. The electronic device of claim 15, wherein, to determine formants of the input audio window, the circuitry is configured to
determine a first power spectrum using a first number of bands;
determine a second power spectrum using a second number of bands, larger than the first number of hand
smooth the first power spectrum;
smooth the second power spectrum more than the first power spectrum;
determine a difference between the first power spectrum and the second power spectrum.

18. The method of claim 1, wherein the window of the input audio file generates a plurality of sequential input audio windows, each of which is subject to operations as the input audio window.

19. The method of claim 5, wherein determining formants of the input audio window includes determining a difference between the first power spectrum and the second power spectrum.

20. The method of claim 19, wherein the first power spectrum is over fewer bands than the second power spectrum and the second power spectrum is smoother than the first power spectrum.

* * * * *